(12) United States Patent
Makowski et al.

(10) Patent No.: US 12,087,614 B2
(45) Date of Patent: Sep. 10, 2024

(54) GAP FILL DIELECTRICS FOR ELECTRICAL ISOLATION OF TRANSISTOR STRUCTURES IN THE MANUFACTURE OF INTEGRATED CIRCUITS

(71) Applicant: Intel Corporation, Santa Clara, CA (US)

(72) Inventors: Michael Makowski, Beaverton, OR (US); Sudipto Naskar, Portland, OR (US); Ryan Pearce, Beaverton, OR (US); Nita Chandrasekhar, Portland, OR (US); Minyoung Lee, Vancouver, WA (US); Christopher Parker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 752 days.

(21) Appl. No.: 17/127,860

(22) Filed: Dec. 18, 2020

(65) Prior Publication Data
US 2022/0199458 A1   Jun. 23, 2022

(51) Int. Cl.
*H01L 29/06* (2006.01)
*H01L 21/02* (2006.01)
(Continued)

(52) U.S. Cl.
CPC .. *H01L 21/76224* (2013.01); *H01L 21/02164* (2013.01); *H01L 21/02274* (2013.01);
(Continued)

(58) Field of Classification Search
None
See application file for complete search history.

(56) References Cited

U.S. PATENT DOCUMENTS

2018/0330980 A1* 11/2018 Liang ............... H01L 21/76224
2018/0374755 A9   12/2018 Liu
(Continued)

FOREIGN PATENT DOCUMENTS

| EP | 3620549 | 3/2020 |
| WO | 2009149167 | 12/2009 |

OTHER PUBLICATIONS

Extended European Search Report from European Patent Application No. 21197096.7 notified Mar. 18, 2022, 7 pgs.

*Primary Examiner* — Asok K Sarkar
(74) *Attorney, Agent, or Firm* — Essential Patents Group, LLP

(57) ABSTRACT

Transistors structures comprising a semiconductor features and dielectric material comprising silicon and oxygen in gaps or spaces between the features. The dielectric material may fill the gaps from bottom-up with an atomic layer deposition (ALD) process that includes a silicon deposition phase, and an oxidation phase augmented by $N_2$:$NH_3$ plasma activated nitrogen species. Being plasma activated, the nitrogen species have short mean free paths, and therefore preferentially passivate surfaces with low aspect ratios. This aspect-ratio dependent passivation may increase an energy barrier to surface reactions with a silicon precursor, resulting in a concomitant differential in deposition rate. With $N_2$:$NH_3$ plasma passivation, deposited dielectric material may have a nitrogen concentration that varies by at least order of magnitude as a function of the aspect ratio of the filled gaps.

10 Claims, 10 Drawing Sheets

(51) Int. Cl.
*H01L 21/762* (2006.01)
*H01L 29/66* (2006.01)
*H01L 29/78* (2006.01)

(52) U.S. Cl.
CPC ...... *H01L 21/0228* (2013.01); *H01L 29/0649* (2013.01); *H01L 29/66795* (2013.01); *H01L 29/7851* (2013.01)

(56) References Cited

U.S. PATENT DOCUMENTS

2019/0385898 A1\* 12/2019 Peng ................ H01L 21/02271
2020/0075342 A1\* 3/2020 Chen ................ H01L 21/31144

\* cited by examiner

GAP FILL DIELECTRICS FOR ELECTRICAL ISOLATION OF TRANSISTOR STRUCTURES IN THE MANUFACTURE OF INTEGRATED CIRCUITS

BACKGROUND

Demand for higher performance integrated circuits (ICs) in electronic device applications has motivated increasingly dense transistor architectures. Electrically isolating adjacent devices, for example by depositing dielectric material between adjacent transistor structures has become a greater challenge as transistor density and surface topography increases.

Although often still referred to as "shallow trench isolation" (STI), the act of filling spaces between transistor structures has become increasingly difficult because the aspect ratio of trenches between adjacent structures has increased markedly over the last few generations of transistor technology as fins have become taller, for example to accommodate stacks of nanoribbon channels, and narrower, for example to combat the short channel effect. The difficulty in STI gap filling is further exacerbated by the need to avoid oxidizing the fin structures, which are often predominantly silicon, during the deposition of dielectric material.

Much effort has been expended to develop non-oxidizing gap filling STI technology, which might for example employ spin-on, or flowable dielectric materials. However, such techniques often need elaborate post-deposition cure treatments to control fin oxidation, which increase manufacturing costs. Conventional STI processes may also include various dielectric liners that are deposited over surfaces of the transistor structures. Such dielectric liners often include a silicon nitride layer, which because of high film stress, can induce fins to bend or deflect from an ideal upright orientation.

Alternative dielectric material deposition techniques and dielectric isolation structures that can address these issues would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
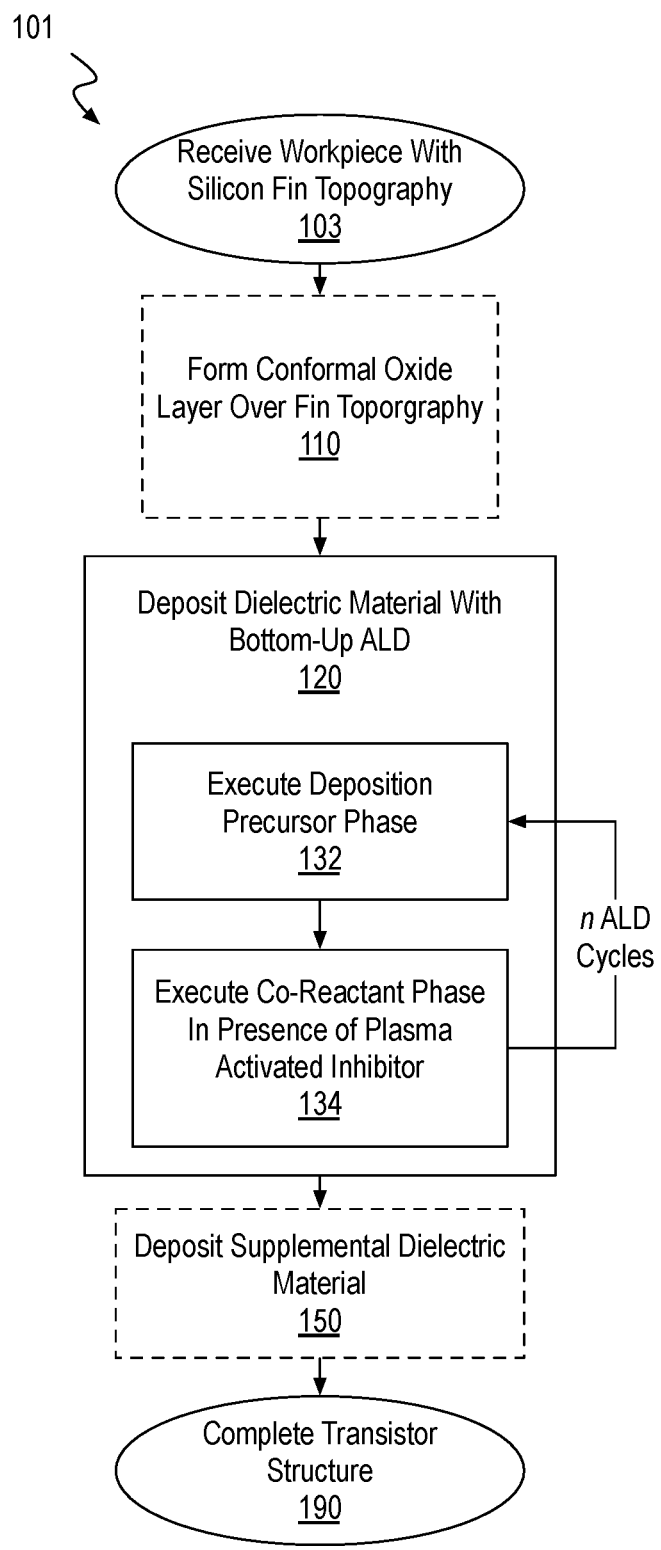
FIG. 1 is a flow diagram illustrating methods for forming transistor structures with a bottom-up isolation dielectric deposition process, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

FIG. 1 is a flow diagram illustrating method 101 for forming an isolation dielectric between transistor structures with a bottom-up deposition process, in accordance with some embodiments. Bottom-up, or super-conformal (i.e., superfilling), deposition described in the context of methods 101 are suitable as a singular process for depositing $SiO_2$ within gaps between topography, for example. The bottom-up deposition, and attributes of the resulting dielectric material, may be applicable to various applications within in the manufacture of ICs where gap fill and/or materials challenges exist. For example, dielectric deposition described in the context of methods 101 may be practiced in the fabrication of an integrated circuit (IC) whenever a dielectric is to be deposited over a material that is sensitive to oxidation. The practice of methods 101 may also be particularly advantageous when high aspect ratio topography is to be filled with dielectric.

Methods 101 begin at input 103 where a workpiece including a non-planar surface is received. In some embodiments, the workpiece is a large format (e.g., 300-450 mm) wafer. The wafer may include a Group IV semiconductor material layer (e.g., Si, Ge, SiGe, GeSn, etc.), a Group III-V semiconductor material layer, or a Group II-VI semiconductor material layer, for example. In exemplary embodiments, the working surface of the wafer has significant topography, for example associated with a patterning of fins (or pillars) into the semiconductor material layer.

Figure 2A:
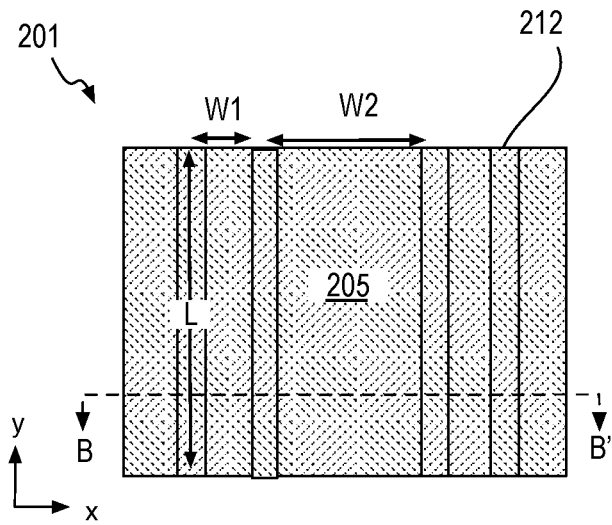
FIGS. 2A and 3A are plan views of transistor structures evolving to include a conformal base layer of isolation dielectric as the methods illustrated in FIG. 1 are practiced in accordance with some embodiments.
Figure 2B:
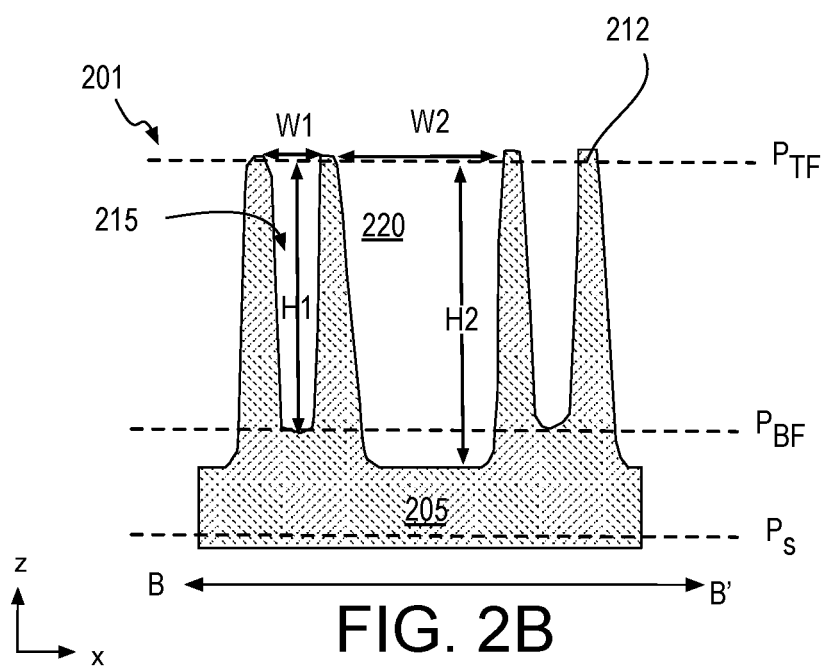
FIGS. 2B and 3B are cross-sectional views of the transistor structures illustrated in FIGS. 2A and 3A, respectively.

FIG. 2A is plan view of a portion of an exemplary workpiece that includes a plurality of transistor structures 201. As received, transistor structures 201 comprise only a plurality of fins 212. Each fin 212 has a longitudinal length L in a first dimension (e.g., x) over a surface of the substrate, and a transverse width in a second dimension (e.g., y). FIG. 2B is a cross-sectional view of the transistor fin structures 201 illustrated in FIG. 2A along the B-B' line. As shown in FIG. 2B, each fin 212 extends at a height (e.g., z-dimension) from a plane of a substrate material 205. In this example, fins 212 have been patterned into a portion of the thickness of substrate material 205. In some embodiments, fins 212 comprise silicon, and may be predominantly (i.e., more than 50%) silicon. In specific examples where substrate material 205 is substantially monocrystalline silicon, fins 212 are also substantially monocrystalline silicon. In some other embodiments, fins 212 comprise a laminate structure of multiple layers having different chemical compositions (not depicted). For example, at least some portion of fins 212 may comprise bilayers of predominantly silicon layers and predominantly non-silicon (e.g., Ge) layers.

As shown in FIGS. 2A and 2B, fins 212 may be spaced apart by gaps of varying width between a small gap width W1 and a large gap width W2, as measured at a plane $P_{TF}$ that intersects a top surface of fins 212. As further illustrated in FIG. 2B, fins 212 may have a tapered profile with a bottom of fins 212 being somewhat wider (e.g., in x-dimension) than their top transverse widths. A small space or gap 215 having the minimum width W1, has a height (depth) H1, as measured between plane $P_{TF}$ and a plane $P_{BF}$ that intersects a bottom of two adjacent fins 212 that together define the small space 215. Reference planes $P_{TF}$ and a plane $P_{BF}$ are substantially parallel to each other, and substantially parallel to a global plane $P_s$ of the substrate The large space 220 having the large gap width W2, has a height (depth) H2 exceeding H1, for example as a result of pattern dependent variation in the etch process(es) employed to form fins 212. Small space 215 has an aspect ratio (W1:H1) that is significantly greater than the aspect ratio (H2:W2) of large space 220 because the difference between heights H1 and H2 does not scale with the difference in widths H1 and H2. In the illustrated embodiment, the aspect ratio of small space 215 is at least 6:1 (i.e., >6) while the aspect ratio of large space 220 is less than 3:1 (i.e., <3). The aspect ratio of small space 215 is therefore more than twice the aspect ratio of large space 220. The gap widths W1 and W2 may vary with transistor technology node. Height H1 may also vary, for example as a function of whether a single channel or multiple channel transistor is to be fabricated within fins 212. As such, the aspect ratio of small space 215 may exceed 10:1 in some embodiments. Although dimensions may vary, in some examples, gap width W1 is no more than 100 nm, and may be less than 25 nm (e.g., 5-15 nm). For these examples, gap width W2 may be approximately 100 nm, or more.

Returning to FIG. 1, methods 101 may include an optional formation of a substantially conformal dielectric material at block 110. In FIG. 1, block 110 is illustrated in dashed line to emphasize the practice of block 110 is optional. Although optional, conformally deposited dielectric material is advantageously formed in a manner that minimizes oxidation of the underlying (fin) material, and once deposited, the presence of this initial dielectric material may reduce any effects a bottom-up deposition process might otherwise have on the composition of the underlying material.

In some implementations of block 110, conformal dielectric material is deposited directly on the working surface with a thermal atomic layer deposition (ALD) process. In contrast to plasma enhanced ALD, half reactions of a thermal ALD cycle are thermally driven. In exemplary embodiments, the thermal ALD cycle practiced at block 110 comprises a deposition phase during which a silicon precursor is introduced, and a co-reactant phase where an oxygen precursor is introduced. One or more such cycles may be performed to form one or more layers of thermal silicon dioxide ($SiO_2$) upon the working surface. Various trace levels of impurities, such as hydrogen and/or carbon, may be unintentionally introduced into the thermal $SiO_2$, but the material may be otherwise substantially pure $SiO_2$. For an embodiments where the working surface comprises fins of predominantly silicon, the sequential and self-limiting nature of the half cycles ensures the fin material is minimally oxidized and that the dielectric material forms conformally over even extreme topography.

Figure 3A:
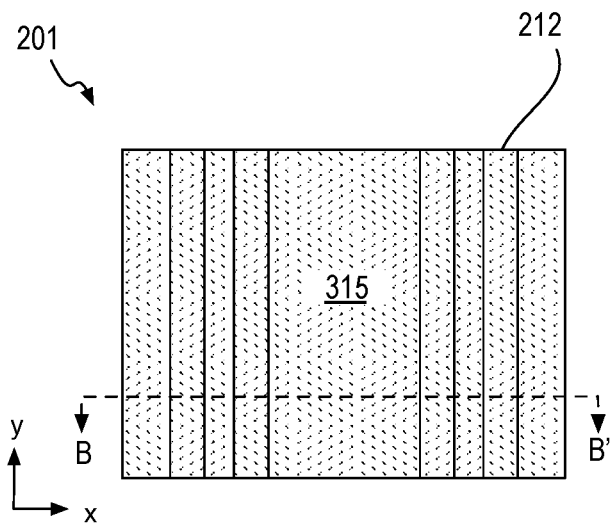
Figure 3B:
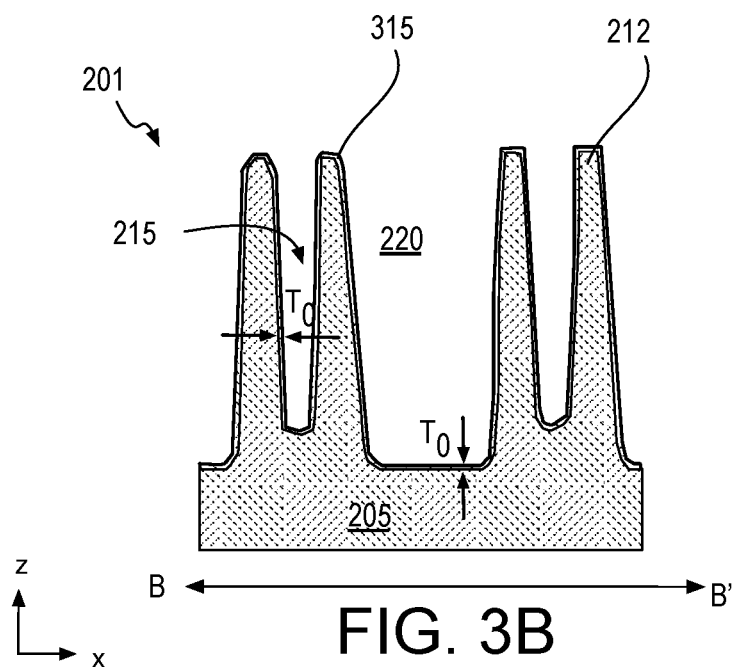

FIGS. 3A and 3B illustrate a plan and cross-sectional view of transistor structures 201 evolving to include thermal $SiO_2$ layer 315. As shown, thermal $SiO_2$ layer 315 is conformal with a layer thickness $T_0$ both adjacent to sidewalls of fins 212 within small space 215 and at the bottom of large space 220. Although thickness $T_0$ may vary with implementation, in exemplary embodiments $T_0$ is 0.5-2.0 nm.

Returning to FIG. 1, methods 101 continue at block 120 where dielectric material is deposited with a super-conformal, bottom-up ALD process that is plasma enhanced. In exemplary embodiments where block 110 is practiced, the PEALD process practiced at block 120 is performed without breaking vacuum between the thermal ALD process and the PEALD process (i.e., in-situ). In the PEALD process practiced at block 120 a deposition phase is executed at block 132 during which a silicon precursor is again introduced. At block 134, an oxygen precursor is introduced during execution of a co-reactant phase. Hence, the dielectric deposited at block 120 again comprises silicon and oxygen. However, plasma activated inhibitor species are introduced at block 134.

The inhibitor species compete with the oxidation half reaction more or less successfully as a function of the topography of the working surface because plasma activated inhibitor species are more likely to adsorbed onto surfaces that see greater inhibitor species flux. As a result of short mean free paths of the inhibitor species generated by the plasma at the deposition pressure, surfaces shadowed from the inhibitor species can remain unpassivated. Once an inhibitor is adsorbed, reactions between the deposition precursor and a passivated site occurs at a lower rate during the subsequent deposition phase than do reactions between the deposition precursor and an unpassivated site. Hence, because the surface passivation is dependent on the aspect ratio(s) of the surface topography, the cyclical deposition process performed at block 120 proceeds at a lower rate within gaps of lower aspect ratio Although the plasma activated inhibitors have any chemical composition that will reduce the rate of one or both of silicon precursor deposition and oxidation half reactions, the plasma activated inhibitors advantageously comprise species that will not significantly alter the chemical composition of the underlying material. In some exemplary embodiments where the underlying material is predominantly silicon, the plasma activated inhibitor(s) comprise nitrogen. Inhibitors comprising nitrogen may be supplied in the form of one or more precursors. In some examples, the inhibitor precursor is $N_2$ gas. In other examples, the inhibitor precursor is $NH_3$ gas. In still other examples, the inhibitor precursor is a forming gas (e.g., <5% $H_2$:$N_2$). As further described below, at least two such inhibitor precursors may be advantageously co-flowed and plasma activated.

Figure 4A:
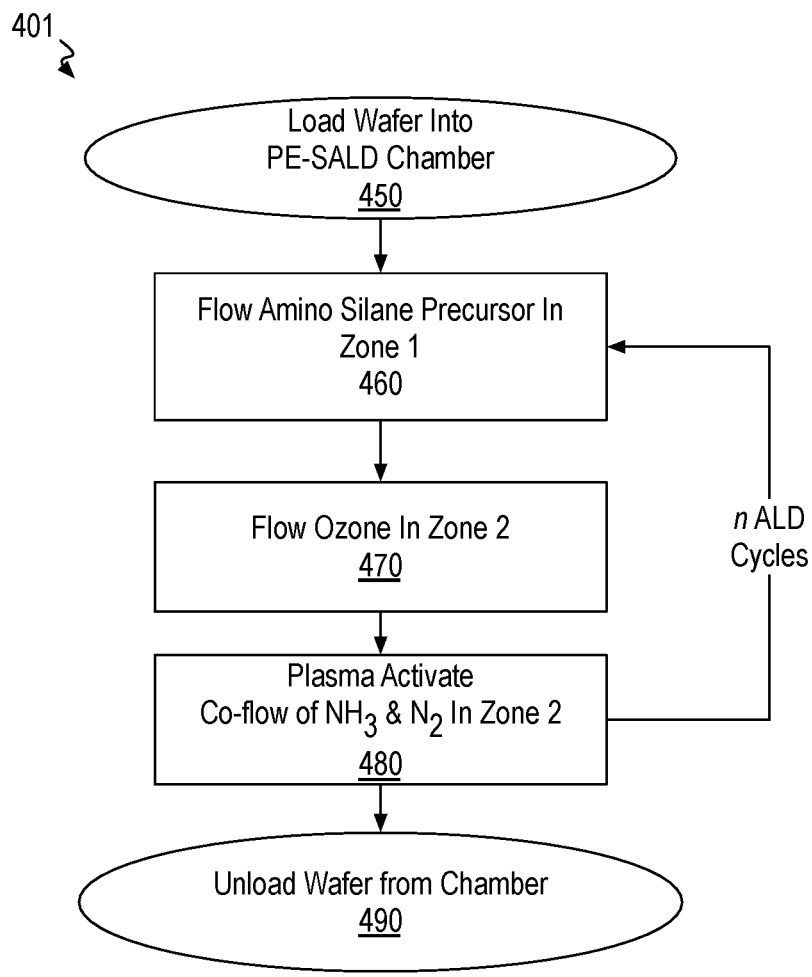
FIG. 4A is a flow diagram illustrating a plasma enhanced spatial atomic layer deposition process, in accordance with some embodiments of the bottom-up dielectric deposition methods introduced in FIG. 1.

Although block 120 may be practiced in any suitable ALD chamber, in some advantageous embodiments, at least block 120 is performed in a plasma enhanced spatial ALD (PE-SALD) chamber. In some exemplary embodiments including the thermal ALD block 110, both block 110 and block 120 are performed in an PE-SALD chamber. FIG. 4A is a flow diagram illustrating PE-SALD methods 401. Methods 401 may be practiced as the bottom-up ALD process performed at block 120, in accordance with some embodiments, for example. Methods 401 begin at input 450 where an IC workpiece (e.g., wafer) is loaded into a PE-SALD chamber. PE-SALD chambers are available from a number of commercial sources, such as, but not limited to, Tokyo Electron Ltd. (TEL) of Japan, and Applied Materials (AMAT) of U.S.A.

Figure 4B:
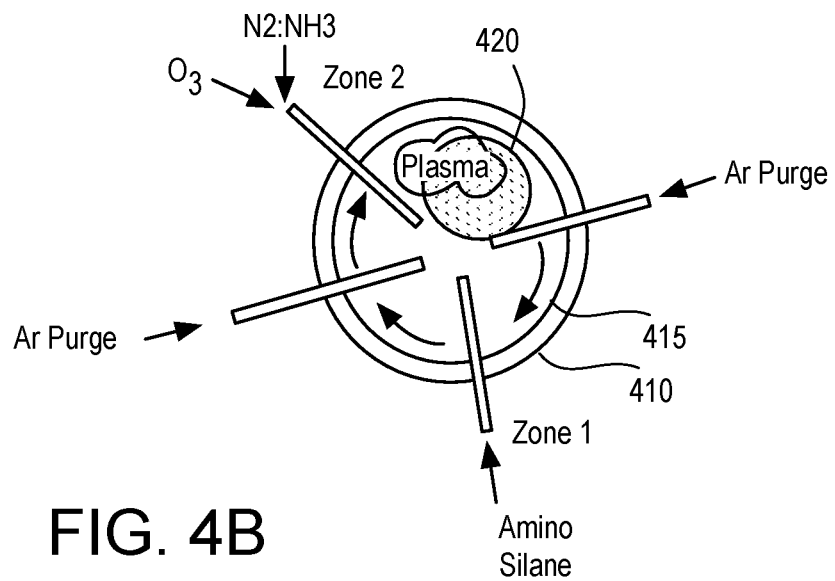
FIG. 4B is a top-down plan view of a schematic of a plasma enhanced spatial atomic layer deposition (PE-SALD) chamber suitable for performing the methods illustrated in FIG. 4A.

FIG. 4B is a top-down, plan view schematic of a PE-SALD system 402 that is suitable for practicing the methods 401. PE-SALD system 402 includes a chamber 410 within which a wafer 420 has been loaded upon at rotatable platen or chuck 415. At block 460 (FIG. 4A), a silicon precursor is introduced into a first zone of chamber 410 (FIG. 4B). In exemplary embodiments, the silicon precursor is an amino silane known to be suitable for thermal ALD of $SiO_2$. As further illustrated in FIG. 4A, at block 470 an oxygen precursor may be introduced into a second zone of chamber 410 (FIG. 4B). In exemplary embodiments, the oxygen precursor is ozone. In other embodiments, the oxygen precursor is hydrogen peroxide. However, any oxygen precursor known to be suitable for thermal ALD of $SiO_2$ may instead be introduced into the second zone of chamber 410.

As shown in FIG. 4B, the two zones within chamber 410 are spatially separated by one or more intervening zone(s) where one or more non-reactive purge gases (e.g., Ar) are introduced. As platen 415 is rotated (e.g., clockwise) during the practice of methods 401, wafer 420 alternately passes through the first and second chamber zones with each revolution while the precursors are continuously flowed. One full revolution of platen 415 therefore corresponds to one ALD cycle in methods 401. Any number of ALD cycles may be executed before the deposition is terminated and the wafer is unloaded at output 490

As further illustrated in FIG. 4A, at block 480 of the PE-SALD cycle, the inhibitor precursor is plasma activated within zone two. In the illustrated example, the two inhibitor precursors, $N_2$ and $NH_3$ are co-flowed and energized into a plasma, for example with any suitable RF generator or magnetron. Although a single nitrogen precursor may be supplied, a co-flow may be particularly advantageous for controlling surface passivation as a function of the partial pressure of $N_2$ and $NH_3$. Notably, the inventors have found a high flow of $NH_3$ alone is not equivalent to a co-flow of $NH_3$ and $N_2$. Specifically, the inventors have found the addition of $N_2$ to $NH_3$ advantageously leads to greater surface inhibition, which is manifested as higher nitrogen concentrations within dielectric deposited over inhibited surface regions. One or more other gases (e.g., an inert such as He, Ar, etc.) may also be energized along with the nitrogen precursor(s). Although FIGS. 4A and 4B illustrate an exemplary nitrogen-based passivation embodiment, other nitrogen-based inhibitor precursors could be similarly introduced into a PE-SALD chamber.

Figure 5:
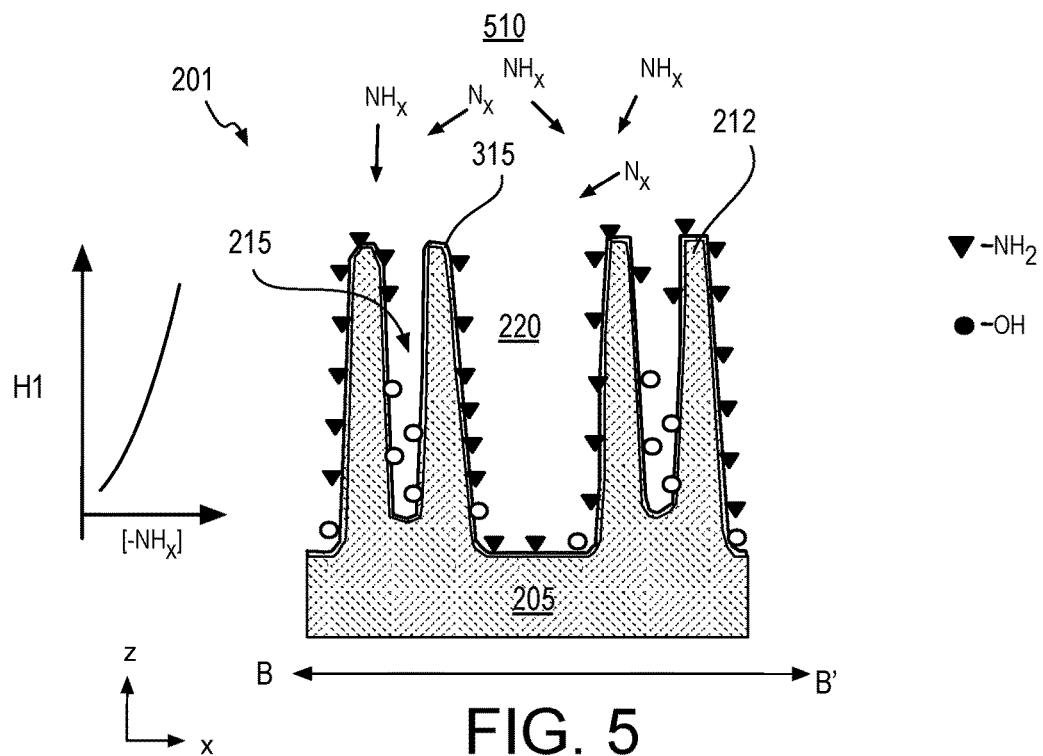
FIG. 5 is a cross-sectional view of transistor structures with aspect-ratio dependent surface passivation as the methods illustrated in FIG. 1 are practiced in accordance with some embodiments.

FIG. 5 is a cross-sectional view of transistor structures 201 that further illustrates aspect-ratio dependent passivation in accordance with some embodiments. The transistor structures 201 shown in FIG. 5 are illustrative of surface chemistry states that might be found within zone two of chamber 410 (FIG. 4B) if both $N_2$ and $NH_3$ are introduced as inhibitor precursors. As shown, a plasma 510 generates activated species $NH_x$, which includes, but is not limited to, $NH_2^+$ ions and $NH_2^+$ radicals. With the addition of nitrogen, plasma 510 also generates activated species $N_x$, which includes, but is not limited to, $N_2+$ ions and $N_2^+$ radicals. The $NH_x$ and $N_x$ species are metastable and able to traverse only a short mean free path before recombining, and so more readily adsorb to surfaces near the top of fins 212 and along fin surfaces surrounding large space 220. Few of the activated $NH_x/N_x$ species are able to enter and adsorb to surfaces of fins 212 within small space 215 before deactivating through a gas-phase recombination reaction. As a result, the density, or concentration, of surface sites passivated by —$NH_x$ ligands declines with depth into small space 215. This decline of inhibitor concentration is qualitatively depicted by the line graph of —$NH_x$ concentration as a function of height H1. The oxygen precursor (e.g., $O_3$) within zone one is however able to adsorb to surface sites deep within small space 215, according to any thermally driven half reaction (e.g., in substantially the same manner that enabled the formation of conformal $SiO_2$ layer 315). Therefore, —OH ligands will adsorb to surface sites deep within small space 215, and do not complete with the $NH_x$ surface reactions occurring within large gap 220, and other regions of less restrictive dimensions.

Figure 6:
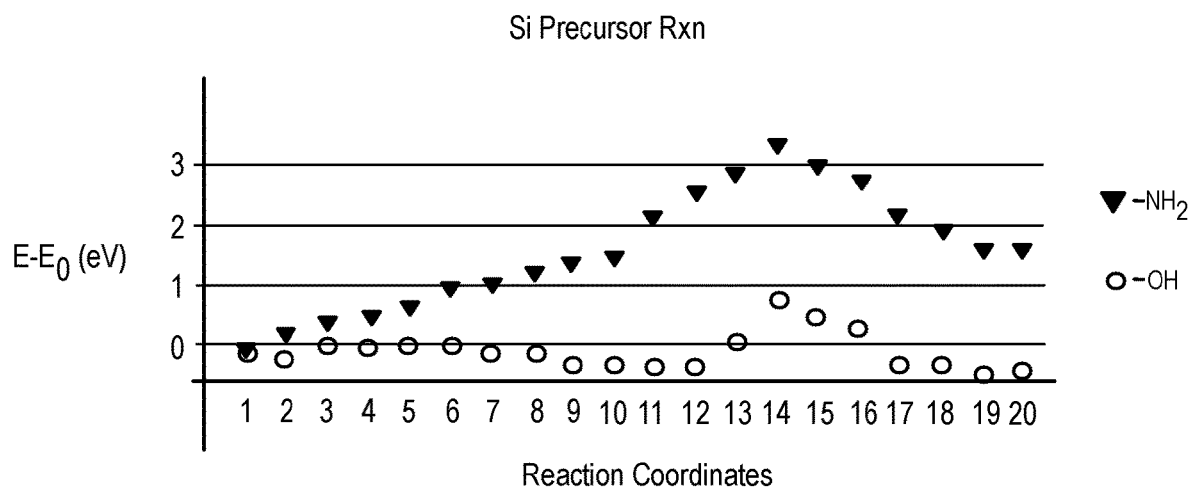
FIG. 6 is a graph of modeled energy barriers associated with the deposition of a silicon precursor onto passivated and unpassivated surfaces, in accordance with some embodiments.

FIG. 6 is a graph of modeled energy barriers associated with the deposition of a silicon precursor onto passivated and unpassivated surface sites, in accordance with some examples. FIG. 6 illustrates results of a simulation using Density Functional Theory (DFT) based Nudged Elastic Band models, which demonstrates the energy barriers required to deposit a particular amino silane precursor using Transition State theory. In the DFT calculations, $NH_2$ surface termination ligands were simulated as a theoretical majority of surface sites exposed to $N_2$:$NH_3$ plasma. Other variants of $NH_x$ surface termination (e.g., —NH ligands) can also occur in smaller quantities, but are expected to show similar behavior to the modeled —$NH_2$ terminated surfaces.

In FIG. 6, the x-axis is sequence of reaction steps between the Si precursor molecule and the native/unpassivated (—OH terminated) and passivated (—$NH_2$ terminated) surface. The energy barrier associated with the —$NH_2$ terminated surface is indicative of the silicon dioxide deposition reaction rate differential attributable to $NH_3$ passivation. As shown, the highest energy needed to overcome the barrier is for —$NH_2$ terminated surfaces (~3.35 eV) while the barrier associated with the native oxide surface is significantly lower (~0.78 eV). Although not bound by theory, this energy difference may be attributable to the directional nature of the —$NH_2$ ligand due to the lone electron pair on nitrogen, which may force incoming silicon precursor molecules to react only when in a specific orientation. This steric limitation is not similarly expressed by the —OH ligands, rendering them more reactive than the —$NH_2$ terminated surface. For the particular parameters modeled in FIG. 6, for example, silicon precursor reactions rates are 1e15-1e19 times faster on —OH terminated surfaces than on —$NH_2$ terminated surfaces. This effect on reaction rate, combined with the aspect ratio dependence of the —$NH_2$ termination, reduces the deposition rate of $SiO_2$ on surfaces where topography dimensions are less restrictive. The effective deposition rate thus becomes superfilling with the addition of the plasma activated inhibitor.

Figure 7A:
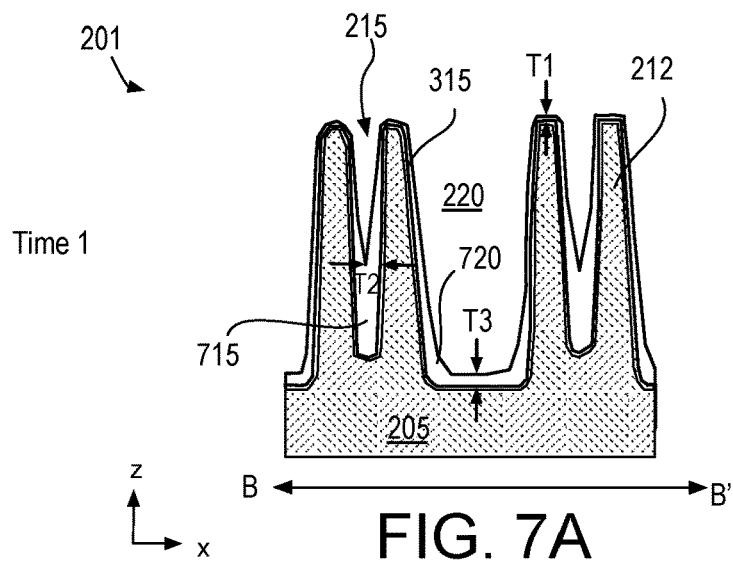
FIGS. 7A, 7B and 7C are cross-sectional views of transistor structures evolving from bottom-up as the methods illustrated in FIG. 1 is practiced in accordance with some embodiments.
Figure 7B:
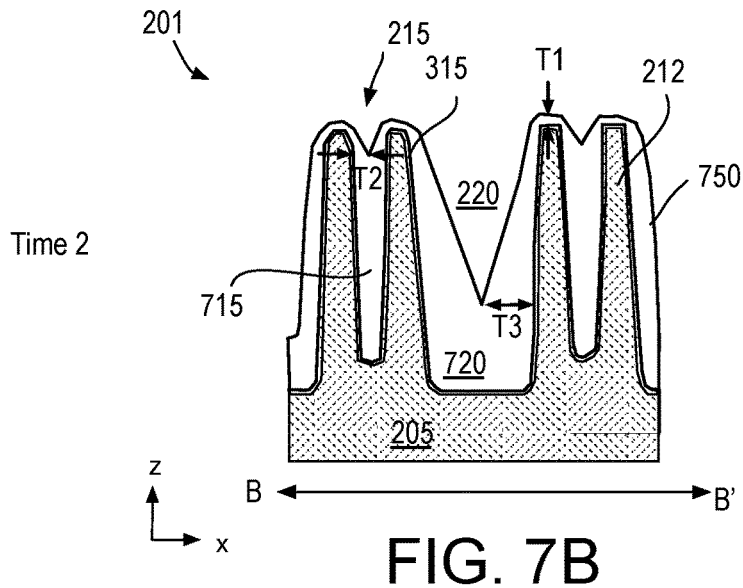
Figure 7C:
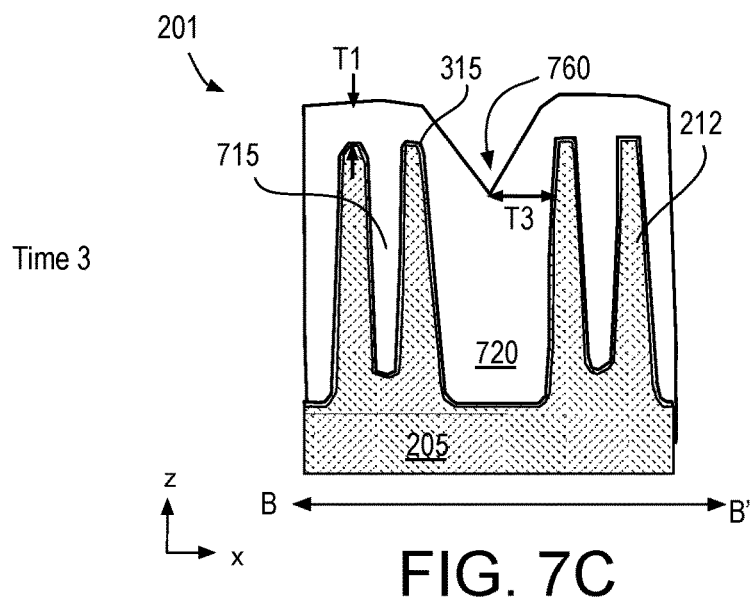

FIGS. 7A, 7B and 7C are cross-sectional views of transistor structure 201 evolving as dielectric material is deposited bottom-up over Time 1, Time 2 and Time 3 in accordance with some embodiments. As shown in FIG. 7A, after a first process time (Time 1), a dielectric material 715 has been deposited within small space 215 to a thickness T2. The thickness T2 is sufficient to fill the bottom portion of small space 215 where the gap width was at a minimum. A dielectric material 720 has been concurrently deposited to a lesser thickness T3 within large space 220. Dielectric thickness T1 is less than both thickness T2 and thickness T3, indicating dielectric deposition is lowest over tops of fins 212.

As further illustrated in FIG. 7B, at a later time process time (Time 2) thickness T2 has increased so that small space 215 is substantially filled with dielectric material 715. At this point, thickness T2 may be in the range of 35-50 nm for wide (e.g., 100 nm) spaces, and 5-20 nm for narrow (e.g., <20 nm) spaces, for example. Thickness T3 within large space 220 has also increased, beginning the bottom filling process. In FIG. 7C, after additional process time (Time 3) small spaces are completely filled and large spaces are nearly filled. A v-groove 760, indicative of the superfilling process, remains only within spaces of largest lateral width.

A superconformal deposition process, such as that practiced at block 120, may be continued until gaps of the surface topography are sufficiently filled with dielectric material, for example as depicted in FIG. 7C. Returning to FIG. 1, methods 101 may then continue at block 150 where any deposition technique capable of suitably high deposition rates may be practiced to further increase the dielectric material thickness, as needed. For exemplary embodiments, a dielectric material is deposited at block 120 to completely cover the underlying topography with a sufficient thickness of dielectric material that a planarization (e.g., polish) process may be performed without exposing the underlying topography. Methods 101 may then complete, for example with the formation of a transistor within one or more of the fin structures at block 190.

Figure 7D:
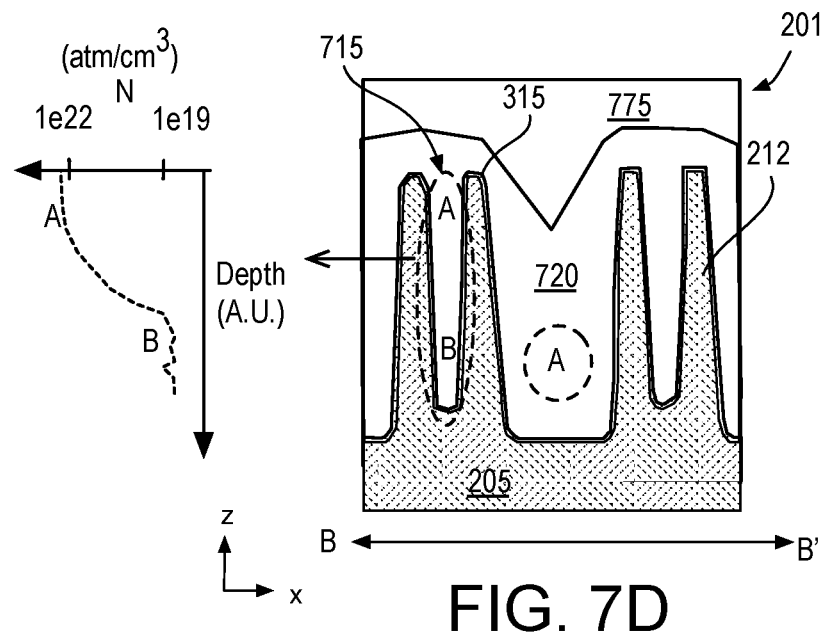
FIGS. 7D, 7E and 7F are cross-sectional views of transistor structures evolving as the methods illustrated in FIG. 1 are practiced in accordance with some embodiments.

FIG. 7D is a cross-sectional views of transistor structures 201 evolving to include an additional cap dielectric 775, a top surface of which has been planarized. Cap dielectric 775 may have any composition, and may for example also comprise silicon and oxygen. The various dielectric materials within transistor structures 201 may be distinguished from alternative isolation dielectric material(s) on the basis of one or more of nitrogen concentration, silicon concentration or oxygen concentration. For example, in accordance with some embodiments where surfaces of high-aspect ratio spaces were passivated to a lesser degree during gap filling, at least a portion of dielectric material 715 within a high aspect ratio gap has a composition different from dielectric material 720 within a low aspect ratio gap. As further shown in FIG. 7D, within dielectric material 715, nitrogen concentration may decrease from region "A" to region "B." In some embodiments, nitrogen concentration may decrease from region "A" to region "B" by at least one order of magnitude, advantageously by at least two orders of magnitude, and may be three orders of magnitude, or more. In some specific embodiments, nitrogen concentration varies from over 1e22 atoms/$cm^3$ within region "A" to about 1e19 atoms/$cm^3$ within region "B"). Because dielectric material 720 was deposited at a relatively lower rate than was dielectric material 715 (at least within region "B"), dielectric material 720 also has the higher region "A" nitrogen concentration. For example, dielectric material 720 may have a nitrogen concentration of more than 1e21 atoms N/cm$^3$, and may be at least 1e22 atoms N/cm$^3$.

The variation in nitrogen content within the dielectrics 715 and/or 720 also impacts oxygen content, with oxygen concentration being lower within region "A" of dielectric materials 715 and 720 than in within region "B." However, the oxygen content in dielectric region "A" is still much higher than in a SiN$_x$ film. For example, oxygen concentration in region "A" may be at least 1e22 atoms/cm$^3$, while within region "B" oxygen concentration may be at least 5e22 atoms/cm$^3$. Silicon concentration may also vary between regions "A" and "B." In some examples, concentration of silicon within region "B" is over 5e22 atoms/cm$^3$ while the concentration of silicon within region "A" is below 5e22 atoms/cm$^3$.

Figure 7E:
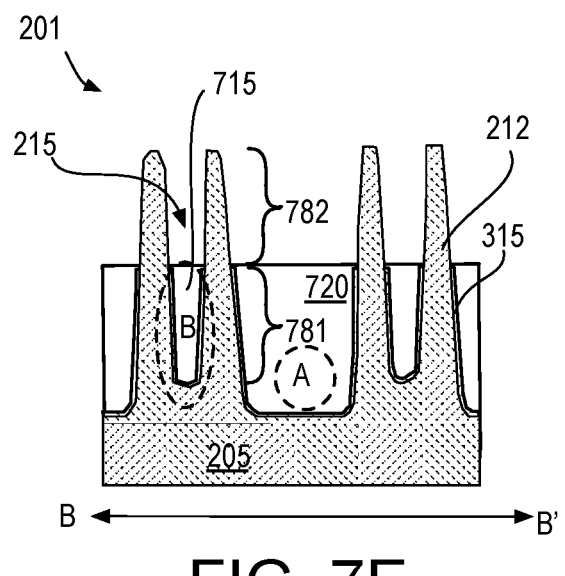

FIG. 7E is a cross-sectional view of transistor structures 201 following a dielectric etchback process, which advances the planarized top surface of cap dielectric 775 to remove substantially all of cap material 775 as well as a portion of dielectric materials 715 and 720. The dielectric etchback process exposes an upper fin portion 782 while dielectric materials 715 and 720 remain adjacent a lower (sub)fin portion 781. Hence, the etchback process has removed most of region "A" of dielectric material 715 so that only the "B" region (where nitrogen concentration is <1e19 atoms/cm$^3$) of dielectric material 715 remains. The remaining isolation dielectric between fins 212 therefore includes only nitrogen-lean Si—O dielectric 715 and nitrogen-rich Si—O dielectric 720.

FIG. 7E is a cross-sectional view of transistor structures 201 following the formation of a gate stack over a channel region of at least one of the fins 212. In the illustrated example, a gate stack is formed over a channel region of both a first transistor structure 701 and a second transistor structure 702. In the exemplary metal-oxide-semiconductor field effect transistor (MOSFET) embodiments, the gate stack includes gate dielectric 705 between fin 212 and a gate electrode 710.

Gate electrode 710 may further include any suitable work function metal around the channel region of fins 212, and in physical contact with gate dielectric 705. Exemplary gate dielectric materials include a high-k metal oxide, such as one comprising predominantly aluminum (e.g., AlO$_x$), one comprising predominantly magnesium (e.g., MgO), one comprising predominantly lanthanum (e.g., LaO$_x$), one comprising predominantly hafnium (e.g., HfO$_x$). In some further embodiments, the gate dielectric material 705 further includes silicon. For example, metal silicates, such as, but not limited to HfSiO$_x$, or TaSiO$_x$ may also be suitable a gate dielectric. Some specific examples of other high-k gate dielectric materials include lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, and lead zinc niobate.

Figure 7F:
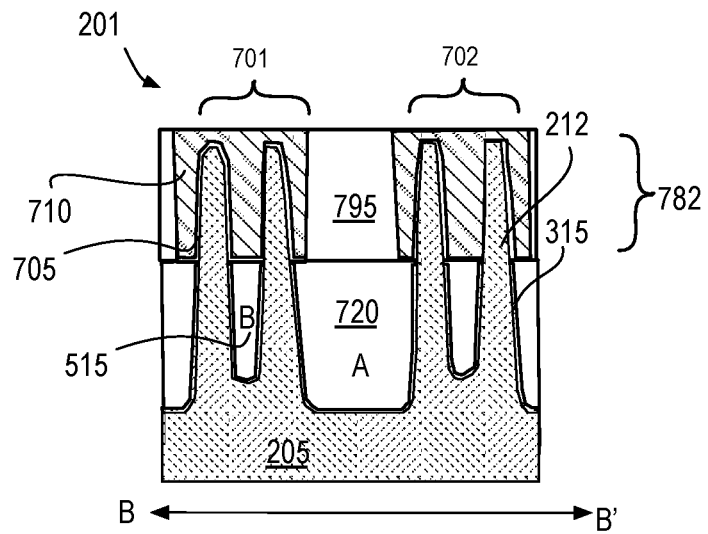

As further illustrated in FIG. 7F, another dielectric material 795 may be deposited over transistor structures 701 and 702. Dielectric material 795 is adjacent to gate electrodes 710, and over dielectric materials 715 and 720 Dielectric material 795 may have any composition, but may be compositionally distinct from at least one of dielectric materials 715 and 720. For example, the nitrogen concentration in dielectric material 795 may be less than at least one of dielectric materials 715 and 720.

Figure 7G:
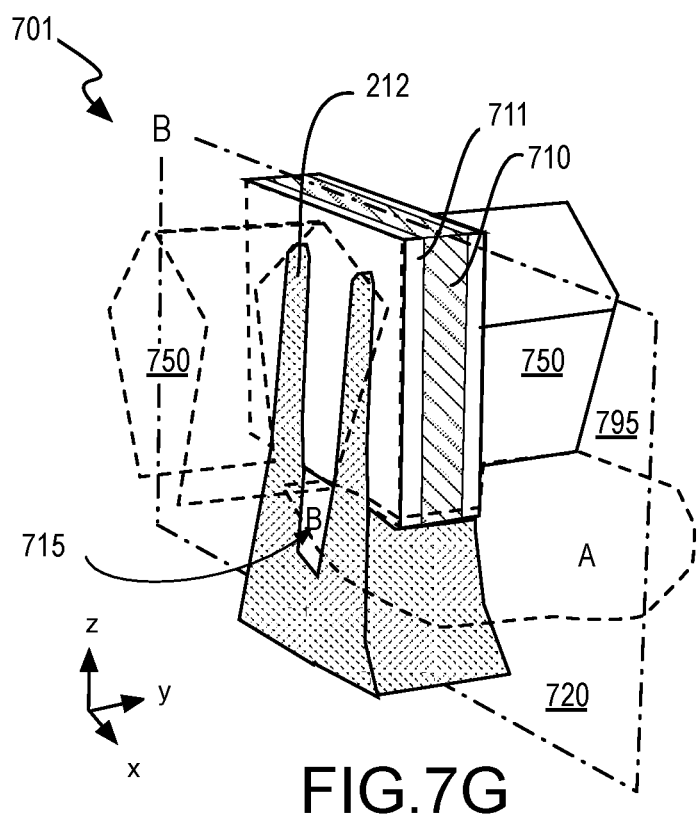
FIG. 7G is an isometric sectional view of a transistor structure following completion of the methods illustrated in FIG. 1, in accordance with some embodiments.

FIG. 7G is an isometric sectional view of transistor structure 701 following completion of the methods 101, in accordance with some embodiments. FIG. 7G further illustrates a source and drain 750 coupled to opposite sides or ends of a channel region of fins 212 that is covered with gate electrode 710. In this example, a spacer dielectric 711 is between gate electrode 710 and source/drain 750. As shown, dielectric materials 715 and 720 are retained within transistor structure 701, for example to function as electrical from other, adjacent transistor structures (not depicted). The various characteristics of dielectric materials 715 and 720 may therefore inform their method(s) of manufacture.

Figure 8:
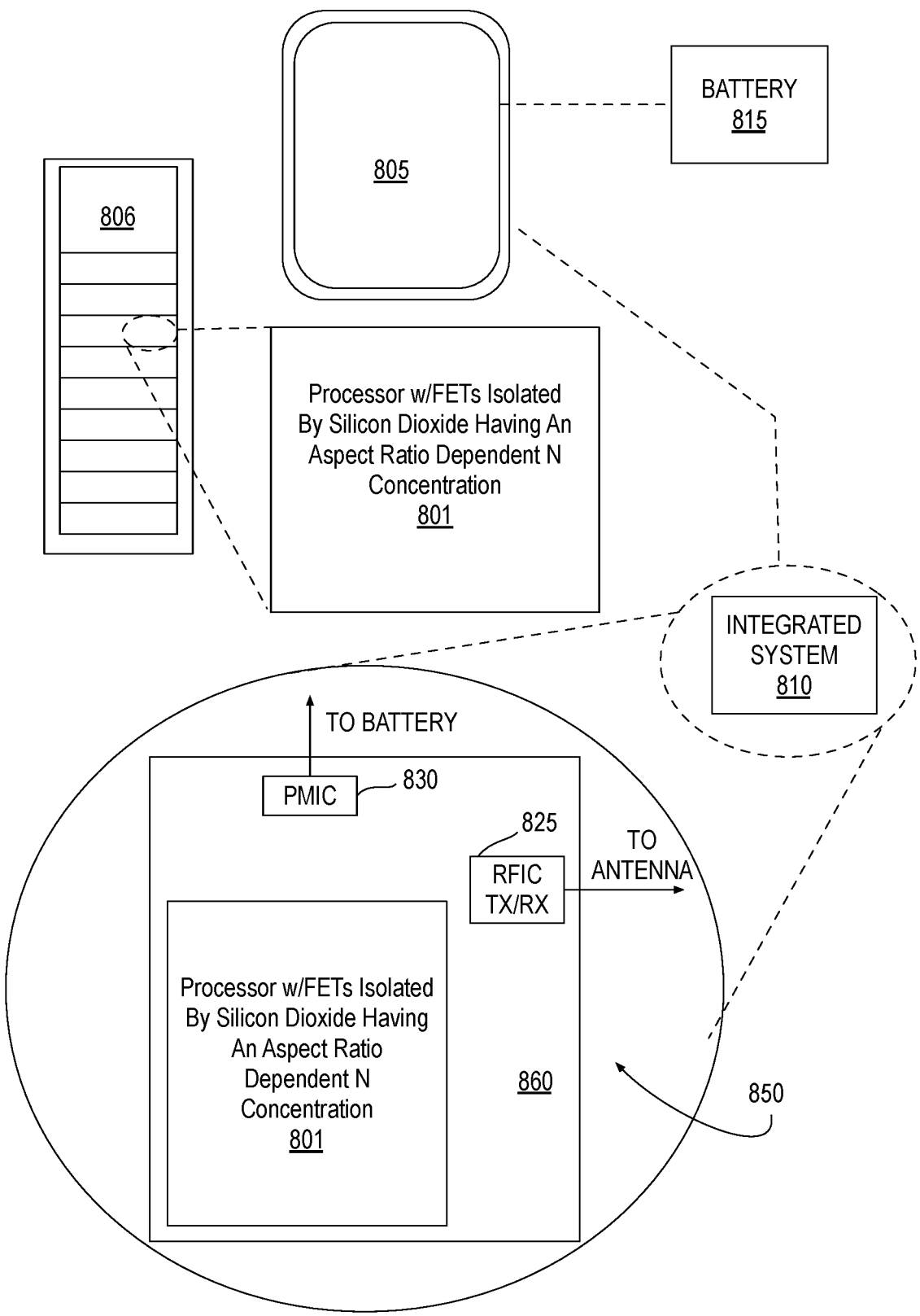
FIG. 8 illustrates a mobile computing platform and a data server machine employing an IC that includes shallow trench isolation dielectric, in accordance with some embodiments.

Transistors structures, and the methods of forming such structures described herein may be integrated into a wide variety of ICs and computing systems. FIG. 8 illustrates a system in which a mobile computing platform 805 and/or a data server machine 806 includes an IC 801 including transistor structures including silicon dioxide isolation dielectric having an aspect ratio dependent N concentration, for example in accordance with some embodiments described elsewhere herein. The server machine 806 may be any commercial server, for example including any number of high-performance computing platforms within a rack and networked together for electronic data processing, which in the exemplary embodiment includes a monolithic IC 801. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level integrated system 810, and a battery 815.

Whether disposed within the integrated system 810 illustrated in the expanded view 850, or as a stand-alone packaged chip within the server machine 806, IC 801 may include memory circuitry (e.g., RAM), and/or a logic circuitry (e.g., a microprocessor, a multi-core microprocessor, graphics processor, or the like). At least one of these circuitries has transistor structures including silicon dioxide isolation dielectric having an aspect ratio dependent N concentration. IC 801 may be further coupled to a board or package substrate 860 that further hosts one or more additional ICs, such as power management IC 830 and radio frequency IC 825. RFIC 825 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
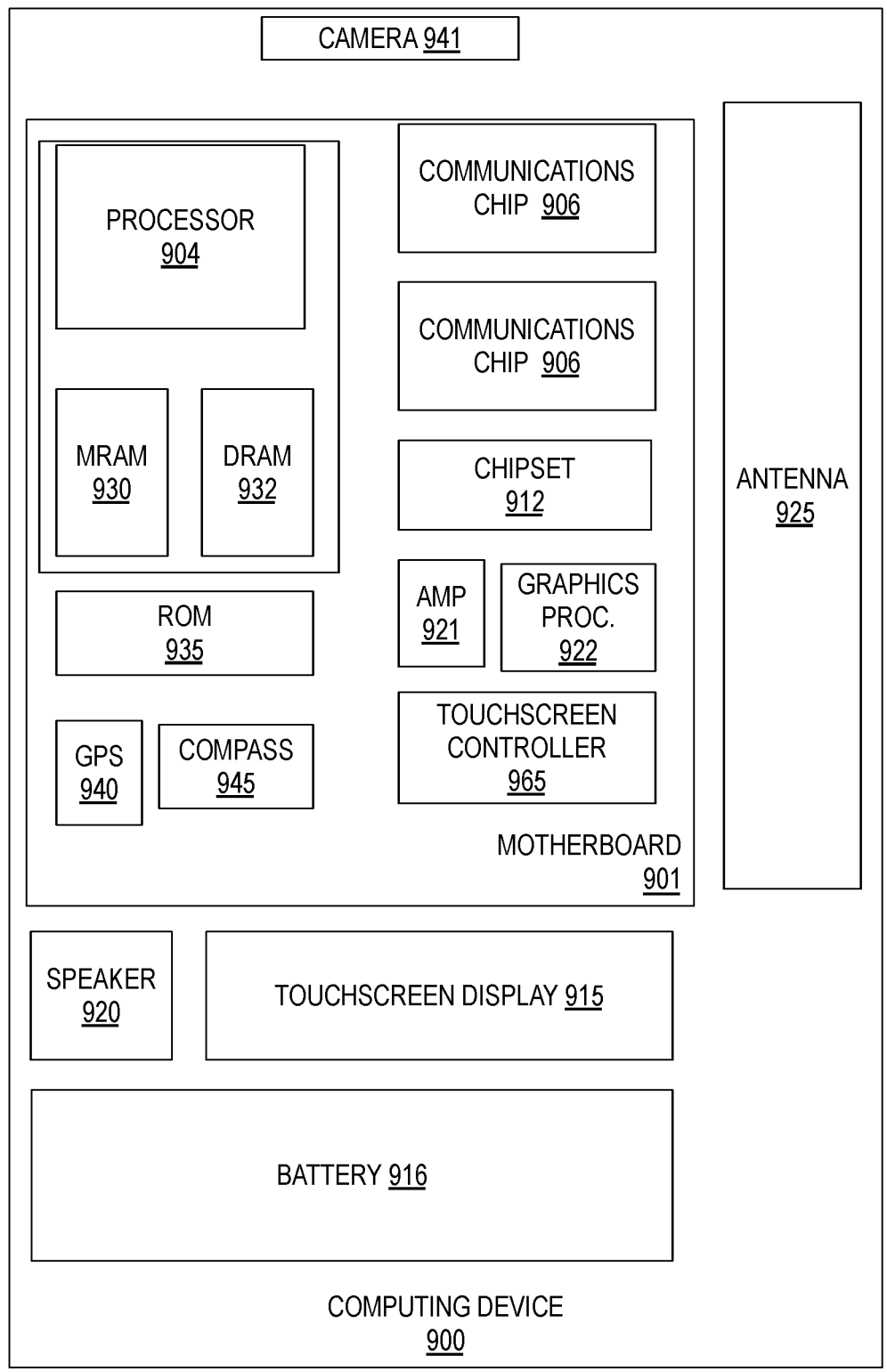
FIG. 9 is a functional block diagram of an electronic computing device, in accordance with some embodiments.

FIG. 9 is a functional block diagram of an electronic computing device 900, in accordance with some embodiments. Device 900 further includes a motherboard 901 hosting a number of components, such as, but not limited to, a processor 904 (e.g., an applications processor). Processor 904 may be physically and/or electrically coupled to motherboard 901. In some examples, processor 904 is part of a monolithic IC structure with transistor structures that include silicon dioxide isolation dielectric having an aspect ratio dependent N concentration, for example in accordance with some embodiments described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 901. In further implementations, communication chips 906 may be part of processor 904. Depending on its applications, computing device 900 may include other components that may or may not be physically and electrically coupled to motherboard 901. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth, or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including, but not limited to, those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, the description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that this disclosure is not limited to the embodiments so described, but can be practiced with modification and alteration without departing from the scope of the appended claims. For example, the above embodiments may include specific combinations of features as further provided below.

In first examples, one or more transistor structures comprise a plurality of features comprising a semiconductor material. The structure comprise a dielectric material in spaces between the features. The dielectric material comprises silicon and oxygen. A first aspect ratio of a first of the spaces between a first adjacent pair of the features is at least twice a second aspect ratio of a second of the spaces between a second adjacent pair of the features. The dielectric material within the first aspect ratio further comprises a first concentration of nitrogen. The dielectric material within the second aspect ratio further comprises a second concentration of nitrogen, greater than the first concentration. The transistor structures further comprise a gate electrode over a channel region of at least one of the features, and a source and a drain adjacent to the gate electrode, and coupled to opposite ends of the channel region.

In second examples, for any of the first examples the semiconductor material comprises silicon, and the second concentration of nitrogen is at least one order of magnitude larger than the first concentration of nitrogen.

In third examples, for any of the second examples the second concentration of nitrogen is at least two orders of magnitude larger than the first concentration of nitrogen.

In fourth examples, for any of third examples the first concentration of nitrogen is less than 1e19 atoms/cm$^3$, and the second concentration of nitrogen is more than 1e21 atoms/cm$^3$.

In fifth examples, for any of the first through fourth examples the dielectric material within the first aspect ratio comprises a first concentration of oxygen and a first concentration of silicon. The dielectric material within the second aspect ratio comprises a second concentration of oxygen and a second concentration of silicon. The second concentration of oxygen is smaller than the first concentration of oxygen. The second concentration of silicon is larger than the first concentration of silicon.

In sixth examples, for any of the fifth examples the second concentration of silicon is more than 5e22 atoms/cm$^3$, and the first concentration of silicon is less than 5e22 atoms/cm$^3$.

In seventh examples, for any of the first through sixth examples both the first and second aspect ratios have a first height from a plane parallel to a plane of the substrate and intersecting a bottom of at least one of the features. The dielectric material is adjacent to only a bottom portion of the first height of the features.

In eighth examples, for any of the seventh examples the features are fins, the channel region is within an upper portion of the fin, the dielectric material is a first dielectric material, and a second dielectric material is over the first dielectric material, and adjacent to the gate electrode.

In ninth examples, a computer system, comprises a power supply, and an IC die further comprising one or more transistor structures. Individual ones of the transistor structures comprise a plurality of features comprising a semiconductor material, and a dielectric material in spaces between the features. The dielectric material comprises silicon and oxygen. A first aspect ratio of a first of the spaces between a first adjacent pair of the features is at least twice a second aspect ratio of a second of the spaces between a second adjacent pair of the features. The dielectric material within the first aspect ratio further comprises a first concentration of nitrogen, and the dielectric material within the second aspect ratio further comprises a second concentration of nitrogen, greater than the first concentration. The ones of the transistor structures further comprise a gate electrode over a channel region of at least one of the features, and a source and a drain adjacent to the gate electrode, and coupled to opposite ends of the channel region.

In tenth examples, for any of the ninth examples further comprising a battery coupled to the power supply.

In eleventh examples, a method of forming transistor structures comprises forming a plurality of features comprising a semiconductor material, and depositing a dielectric material within spaces between the features with a plurality of plasma enhanced atomic layer deposition (PEALD) cycles. Individual ones of the PEALD cycles comprise a first phase in which the spaces are exposed to a silicon precursor, and a second phase in which the spaces are exposed to an oxygen precursor and activated nitrogen species generated from a plasma of both $N_2$ and $NH_3$.

In twelfth examples, for any of the eleventh examples the oxygen precursor comprises ozone or hydrogen peroxide.

In thirteenth examples, for any of the eleventh through twelfth examples the PEALD cycles are performed within a spatial ALD (SALD) chamber, the silicon precursor is introduced within a first zone of the chamber, the oxygen precursor and plasma activated nitrogen species are introduced into a second zone of the chamber, an inert gas is introduced between the first and second zones, and the substrate passes through the first and second zones with each of the cycles.

In fourteenth examples, for any of the eleventh through thirteenth examples depositing the dielectric material with the PEALD process further comprises one or more thermal ALD cycles. Individual ones of the thermal ALD cycles comprise a first phase in which the spaces are exposed to a silicon precursor, and a second phase in which the spaces are exposed to an oxygen precursor in the absence of any plasma activated nitrogen species.

In fifteenth examples, for any of the fourteenth examples the thermal ALD cycles are performed prior to the PEALD cycles.

In sixteenth examples, for any of the eleventh through fifteenth examples the method further comprises depositing a second dielectric material over the dielectric material, planarizing the second dielectric material, and recess etching the second dielectric material and the dielectric material to expose an upper portion of the features.

In seventeenth examples for any of the eleventh through sixteenth examples the method further comprises forming a gate electrode over a channel region in the upper portion of at least one of the features, and forming a source and a drain coupled to the channel region.

In eighteenth examples, for any of the eleventh through seventeenth examples the semiconductor comprises monocrystalline silicon, a first aspect ratio of a first of the spaces between a first adjacent pair of the features is at twice a second aspect ratio of a second of the spaces between a second adjacent pair of the features, the dielectric material is deposited within the first aspect ratio with a first concentration of nitrogen, and the dielectric material is deposited within the second aspect ratio with a second concentration of nitrogen, greater than the first concentration.

In nineteenth examples, for any of the eighteenth examples the second concentration of nitrogen is least one order of magnitude larger than the first concentration of nitrogen.

In twentieth examples, for any of the nineteenth examples the first concentration of nitrogen is less than 1e19 atoms/cm$^3$, and the second concentration of nitrogen is more than 1e21 atoms/cm$^3$.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed.

What is claimed is:

1. One or more transistor structures, comprising:
   a plurality of features comprising a semiconductor material;
   a dielectric material in spaces between the features, wherein:
   the dielectric material comprises silicon and oxygen;
   a first aspect ratio of a first of the spaces between a first adjacent pair of the features is at least twice a second aspect ratio of a second of the spaces between a second adjacent pair of the features;
   the dielectric material within the first aspect ratio further comprises a first concentration of nitrogen; and
   the dielectric material within the second aspect ratio further comprises a second concentration of nitrogen, greater than the first concentration;
   a gate electrode over a channel region of at least one of the features;
   a source and a drain adjacent to the gate electrode, and coupled to opposite ends of the channel region.

2. The transistor structures of claim 1, wherein:
   the semiconductor material comprises silicon; and
   the second concentration of nitrogen is at least one order of magnitude larger than the first concentration of nitrogen.

3. The transistor structures of claim 2, wherein the second concentration of nitrogen is at least two orders of magnitude larger than the first concentration of nitrogen.

4. The transistor structures of claim 3, wherein:
   the first concentration of nitrogen is less than 1e19 atoms/cm$^3$; and
   the second concentration of nitrogen is more than 1e21 atoms/cm$^3$.

5. The transistor structures of claim 2, wherein:
   the dielectric material within the first aspect ratio comprises a first concentration of oxygen and a first concentration of silicon;
   the dielectric material within the second aspect ratio comprises a second concentration of oxygen and a second concentration of silicon;
   the second concentration of oxygen is smaller than the first concentration of oxygen; and
   the second concentration of silicon is larger than the first concentration of silicon.

6. The transistor structures of claim 5, wherein:
   the second concentration of silicon is more than 5e22 atoms/cm$^3$; and
   the first concentration of silicon is less than 5e22 atoms/cm$^3$.

7. The transistor structures of claim 1, wherein:
   both the first and second aspect ratios have a first height from a first plane parallel to a second plane of an underlying substrate and intersecting a bottom of at least one of the features;
   the dielectric material is adjacent to only a bottom portion of the first height of the features.

8. The transistor structures of claim 7, wherein:
   the features are fins;
   the channel region is within an upper portion of the fin;
   the dielectric material is a first dielectric material; and
   a second dielectric material is over the first dielectric material, and adjacent to the gate electrode.

9. A computer system, comprising:
   a power supply; and
   an IC die further comprising one or more transistor structures, individual ones of the transistor structures comprising:
   a plurality of features comprising a semiconductor material;
   a dielectric material in spaces between the features, wherein:
   the dielectric material comprises silicon and oxygen;
   a first aspect ratio of a first of the spaces between a first adjacent pair of the features is at least twice a second aspect ratio of a second of the spaces between a second adjacent pair of the features;

the dielectric material within the first aspect ratio further comprises a first concentration of nitrogen; and the dielectric material within the second aspect ratio further comprises a second concentration of nitrogen, greater than the first concentration;

a gate electrode over a channel region of at least one of the features; and a source and a drain adjacent to the gate electrode, and coupled to opposite ends of the channel region.

10. The computer system of claim 9, further comprising a battery coupled to the power supply.

* * * * *